United States Patent
Nelson et al.

(10) Patent No.: US 6,638,484 B2
(45) Date of Patent: *Oct. 28, 2003

(54) SINGLE DIELECTRIC BARRIER NON-THERMAL PLASMA REACTOR AND METHOD-PLANAR AND SWEPT SHAPES

(75) Inventors: David Emil Nelson, Independence Township, MI (US); Bob Xiaobin Li, Grand Blanc, MI (US); Blaine Roy Danley, Linden, MI (US)

(73) Assignee: Delphi Technologies, Inc., Troy, MI (US)

( * ) Notice: Subject to any disclaimer, the term of this patent is extended or adjusted under 35 U.S.C. 154(b) by 157 days.

This patent is subject to a terminal disclaimer.

(21) Appl. No.: 09/741,781

(22) Filed: Dec. 19, 2000

(65) Prior Publication Data

US 2002/0076366 A1 Jun. 20, 2002

(51) Int. Cl.[7] .................................. B01J 19/08
(52) U.S. Cl. ....................... 422/186.04; 60/275
(58) Field of Search .................. 422/186.04; 60/275

(56) References Cited

U.S. PATENT DOCUMENTS 5,205,990 A * 4/1993 Lawless .................... 422/121
6,338,827 B1 * 1/2002 Nelson et al. ......... 422/186.04

* cited by examiner

*Primary Examiner*—Kishor Mayekar
(74) *Attorney, Agent, or Firm*—Jimmy L. Funke

(57) ABSTRACT

Single dielectric barrier extruded element non-thermal plasma reactors include first and second opposing dielectric barrier layers forming an exhaust channel therebetween, the first barrier layer provided with a first polarity conductor on an interior surface thereof and the second barrier layer provided with a second polarity conductor on the exhaust channel exterior surface. The second barrier layer provides the single dielectric barrier layer. The second polarity conductor serves as a conductor on the channel interior surface of the adjacent exhaust channel in repetitive fashion. The reactors are free of dedicated conductive passages. An electrode coating pattern having conductive coating extending fully to the side walls to connect with side bus connections eliminates the need for internal bus paths. Single dielectric barrier planar and swept-shaped reactor elements have minimal or partially extending internal support ligaments providing enhanced conversion efficiency.

13 Claims, 7 Drawing Sheets

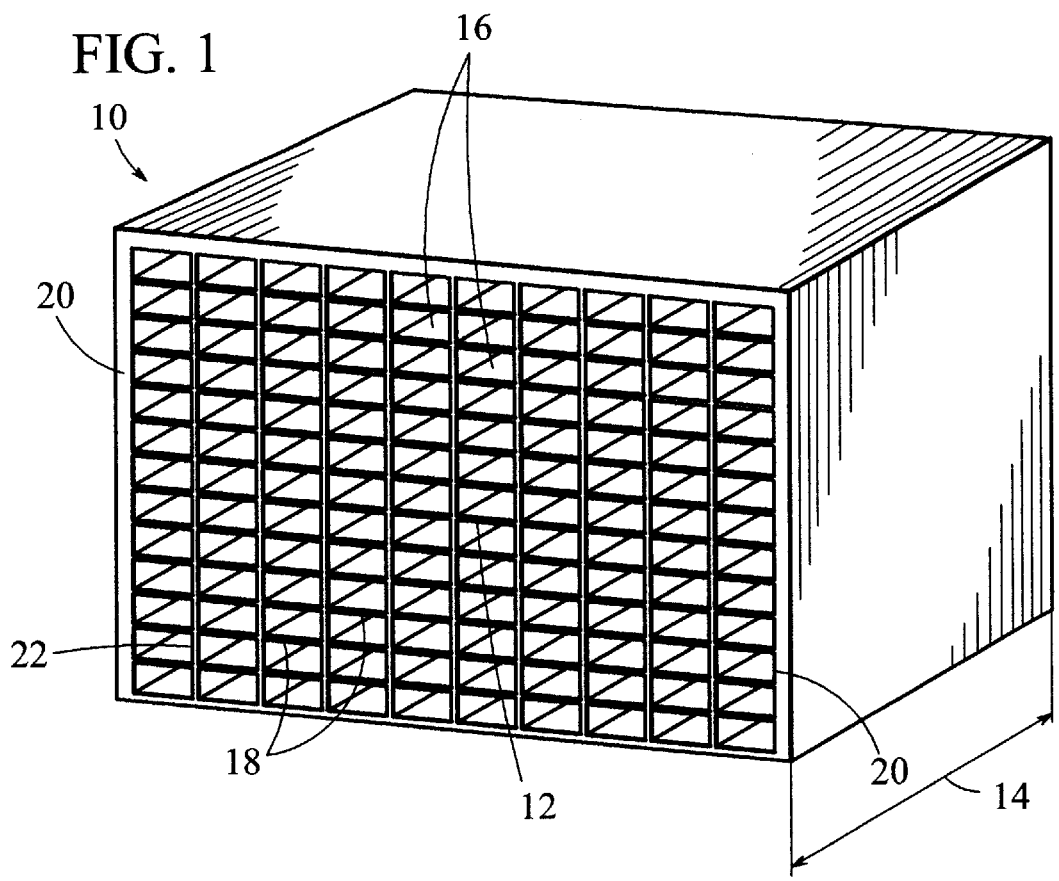
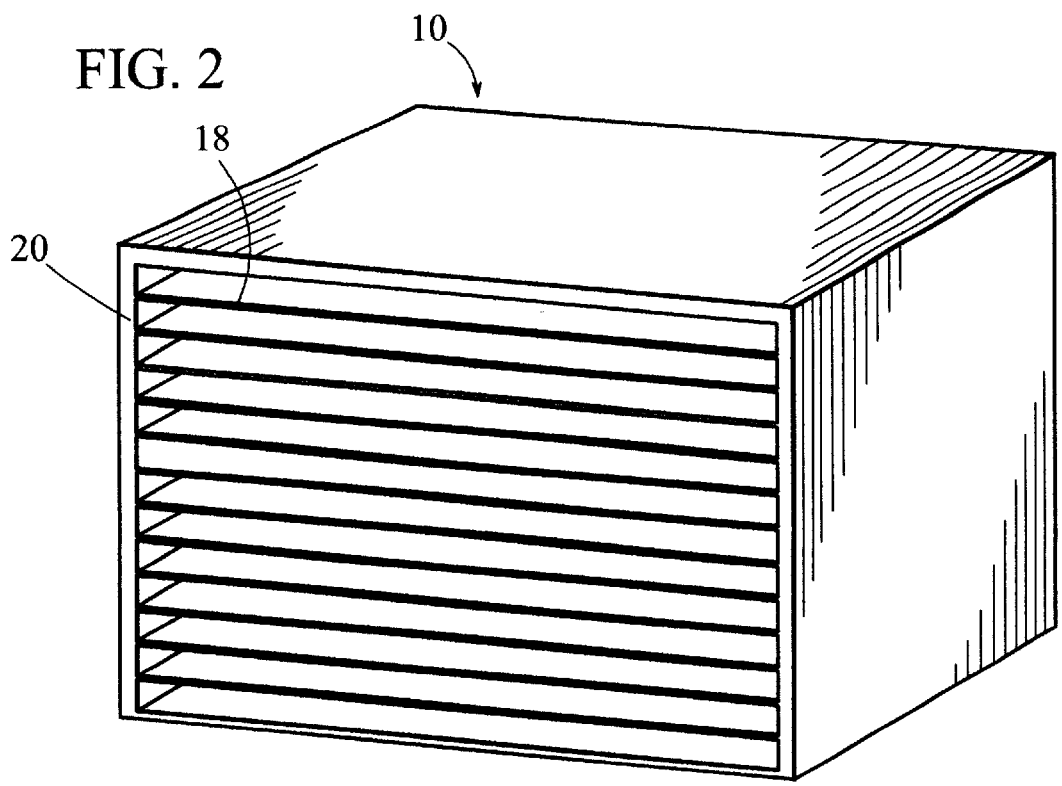

SINGLE DIELECTRIC BARRIER NON-THERMAL PLASMA REACTOR AND METHOD-PLANAR AND SWEPT SHAPES

TECHNICAL FIELD

This invention relates to reactors for chemical reduction of nitrogen oxide (NOx) emissions in the exhaust gases of automotive engines, particularly diesel and other engines operating with lean air fuel mixtures that produce relatively high emission of NOx. More particularly, the invention pertains to single dielectric barrier planar and swept shaped non-thermal plasma reactors.

BACKGROUND OF THE INVENTION

In recent years, non-thermal plasma generated in a packed bed reactor has been shown to be effective in reducing nitric oxides (NOx) produced by power plants and standby generators. These units usually have a reducing agent, such as urea, to enhance the conversion efficiency. The packed bed reactor consists essentially of a high voltage center electrode inserted into a cylinder of dielectric material, usually a form of glass or quartz. An outside or ground electrode is formed by a coating of metal in various forms, including tape, flame spray, mesh, etc. The space between the center electrode and the inside diameter of the dielectric tube is filled or packed with small diameter glass beads. When high voltage alternating current is applied to the center electrode, the surface of the beads go into corona, producing a highly reactive and selective surface for inducing the desired reaction in the gas.

Unfortunately, the packed bed design with its loose beads and glass dielectric is impractical for use in the conditions found in a mobile emitter, such as a car or truck. The vibration and wide temperature swings of the vehicle system would damage the packed bed and the necessary temperature and vibration isolation required to make it survive would not be cost effective.

Cylindrical or planar non-thermal plasma reactors are two common configurations for dielectric barrier discharge type reactors. Both of these configurations are characterized by the presence of one or more insulating layers in a current path between two metal electrodes, in addition to the discharge space.

Commonly assigned U.S. patent co-pending application Ser. No. 09/517,681 filed Mar. 2, 2000 entitled "Plasma Reactor Design for Treating Auto Emissions—Durable and Low Cost," which is hereby incorporated by reference herein in its entirety, discloses a non-thermal plasma reactor element for conversion of exhaust gas constituents. The reactor comprises an element prepared from an extruded monolith of dense dielectric material having a plurality of channels separated by substantially planar dielectric barriers. Conductive material printed onto selected channels form conductive channels that are connected along bus paths to form an alternating sequence of polarity, separated by exhaust channels. Conductive channels and channels not selected for exhaust flow are plugged at end portions of the monolith with a material suitable for excluding exhaust gases and preventing electrical charge leakage between conductive channels. Exhaust channels, disposed between opposite polarity conductive channels, are left uncoated and unplugged. During operation, exhaust gas flows through exhaust channels and is treated by the high voltage alternating current plasma field. The planar shape of the dielectric barriers provides a uniform electrical response throughout the exhaust channels.

Commonly assigned U.S. patent co-pending application Ser. No. 09/517,879 entitled "Plasma Reactor For Treating Auto Emissions—Durable And Low Cost—Curved Shapes," which is hereby incorporated by reference herein in its entirety, and commonly assigned U.S. Pat. No. 6,354,903 entitled "Method Of Manufacture Of a Plasma Reactor With Curved Shape For Treating Auto Emissions," which is also incorporated by reference herein in its entirety, disclose a double dielectric barrier reactor and method for preparing same, respectively. The reactor is characterized by a reactor element prepared from a curved, swept-shaped substrate specifically designed for fabrication via extrusion. The as-extruded curved substrate comprises a thick outer wall surrounding a plurality of channels separated by dielectric barriers. Selected channels are coated with a conductive material to form conductor channels. The prepared reactor element comprises multiple concentric exhaust channels, multiple concentric conductor channels having alternating polarity, each connected to its respective polarity via bus paths, in-line structural support ligaments for providing optimal structural support while preventing exhaust leakage, and thick outer walls providing high crush resistance and allowing robust mounting into the reactor housing.

While the above non-thermal plasma reactors meet some of the current needs and objectives, they provide reactors having exhaust passages that are surrounded by dielectric material ("double dielectric barrier" reactors). There remains a need in the art for an improved, durable, low cost non-thermal plasma reactor and improved method of manufacturing same. There further remains a need for a non-thermal plasma reactor that can be prepared with reduced manufacturing complexity, reduced number of components and reduced overall material cost.

SUMMARY OF THE INVENTION

The present invention provides single dielectric barrier extruded substrate non-thermal plasma reactors having a plurality of single dielectric barriers defining exhaust channels between pairs of the single dielectric barriers. A first barrier layer of a pair of opposing dielectric barrier layers forming an exhaust channel therebetween is provided with a first polarity conductor on an interior surface thereof The second barrier layer of the pair of opposing barrier layers is provided with a second polarity conductor on the exhaust channel exterior surface, whereby the second barrier layer provides the single dielectric barrier layer. The second polarity conductor serves as a conductor on the channel interior surface of the adjacent exhaust channel. The layers are so provided in repetitive fashion until a reactor element of the desired size is achieved. In this way, the reactor provides a configuration that is free of dedicated conductive passages, providing increased active exhaust channel volume compared to comparable double dielectric barrier elements. This further provides improved overall volumetric efficiency.

The extruded reactor element includes cells defined by a single structural dielectric barrier comprising a "conductor-single structural dielectric barrier-exhaust channel-conductor" arrangement, wherein individual cells of the reactor element are defined by a single structural dielectric barrier rather than a double dielectric barrier.

The conductor may comprise conductive materials such as conductive coatings disposed on the single structural dielectric barrier, conductive plates or conductive tubes. In a preferred embodiment, conductors are connected to power and ground without the need for internal bus paths by extending conductive coating fully to the side walls. The bus paths provided on sides of the reactor provide further improved volumetric efficiency. When the reactor element is powered with high voltage alternating current, a non-thermal plasma is formed in the exhaust passages for treating constituents present in the exhaust stream passing through the exhaust passage, the present reactors being particularly suitable for mobile diesel applications.

Advantageously, the present single structural dielectric barrier NTP reactors provide lower manufacturing and material costs over NTP reactors employing double dielectric barrier designs.

The single structural dielectric barrier NTP reactors herein include extruded substrates having any desired shape, including, but not limited to, parallel plates, parallel plates having discrete spacers, C-shaped plates, I-shaped plates, and swept-shaped reactor substrates, such as round, oval, etc., shapes.

The present reactors provide an increase in volumetric efficiency of more than about 100% over comparable double dielectric barrier reactors The present NTP reactor and method comprises single dielectric barrier planar and swept-shaped reactor elements having minimal internal support ligaments. The planar and swept-shaped embodiments having a reduced number of ligaments alone or in combination with partially extending ligaments provide improved conversion efficiency and lower manufacturing cost over comparable designs having greater numbers of internal support ligaments.

In preferred embodiment, a swept-shaped reactor element, such as a concentric tube, is provided having an internal support ligament-free configuration. The ligament-free concentric tube embodiment provides increased conversion efficiency and thin wall capability over comparable single tube, reactors.

These and other features and advantages of the invention will be more fully understood from the following description of certain specific embodiments of the invention taken together with the accompanying drawings.

BRIEF DESCRIPTION OF THE DRAWINGS

Referring now to the drawings, which are meant to be exemplary, not limiting, and wherein like elements are numbered alike in the several Figures:

FIG. 1 provides a view of an as-extruded planar monolith in accordance with one possible embodiment of the present invention.

FIG. 2 provides a view of an as-extruded planar monolith having few structural support ligaments.

DESCRIPTION OF THE PREFERRED EMBODIMENT

Figure 3:
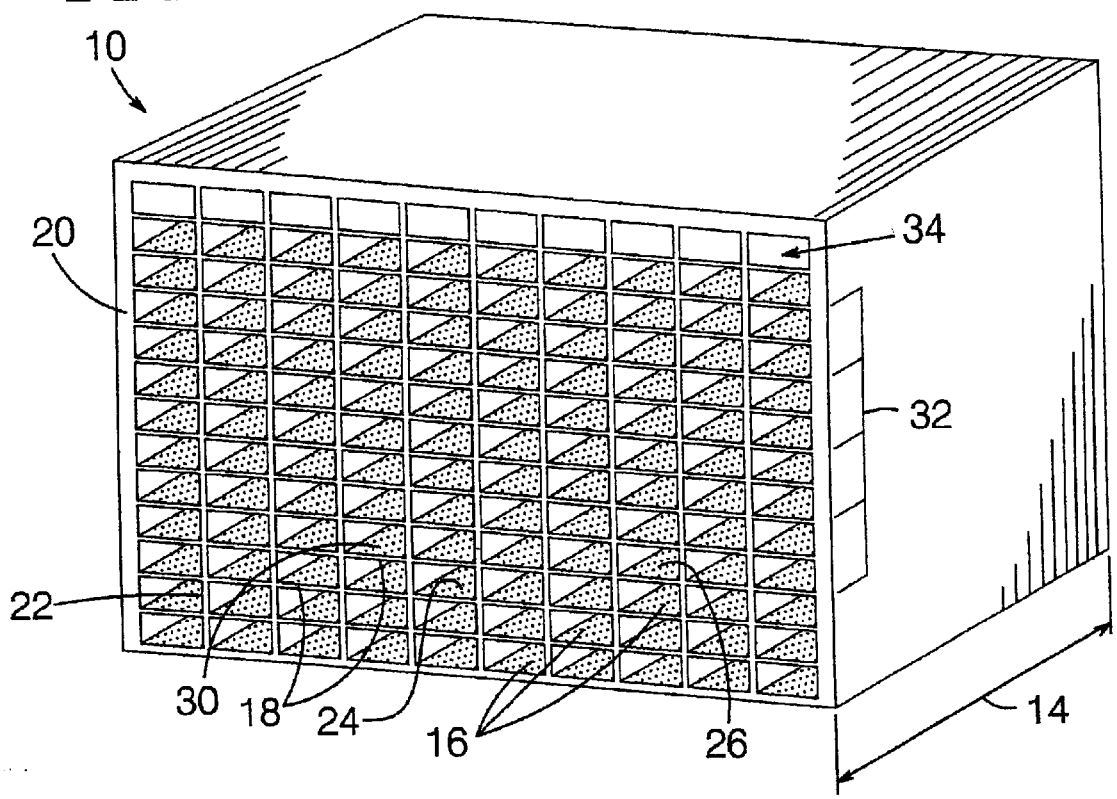
FIG. 3 provides a view of the planar monolith of FIG. 1 after coating.

Turning now to the several FIGS., FIG. 1 provides a perspective view of a planar monolith 10 for preparing one possible embodiment of the present planar single dielectric barrier non-thermal plasma reactor. The extruded planar monolith 10 has a frontal area 12 and a length 14. The frontal area 12 may be rectangular, square, round, or any desired shape. In the planar embodiment, the internal features of the extruded monolith 10 are substantially planar. The as-extruded planar monolith 10 comprises a plurality of exhaust channels 16 defined and separated by substantially planar dielectric barriers 18 and is surrounded by a perimeter boundary wall 20. Internal structural support ligaments 22 are integrally formed as part of the extruded monolith 10. The extruded monolith 10 may be prepared having any number of planar dielectric barriers 18 desired, with about 20 rows typically provided.

Any suitable dielectric substrate material may be employed to form the planar 10 or other shaped monoliths provided herein, including, but not limited to, alumina, dense cordierite, mullite, titania, plastic, high dielectric constant materials, or a combination thereof.

In a preferred embodiment, the substrate is extruded having a minimal number of internal structural support ligaments 22. In a most preferred embodiment, the substrate is provided having an internal structural support ligament-free configuration in the plasma field. FIG. 2 provides a planar monolith 10 being free of internal structural support ligaments.

Alternatively, structural ligaments may be used at the front or rear of the element for increased support without affecting conversion performance provided the ligaments do not extend into the plasma field (not shown). With this alternate approach, conductive print 30 extends only to about 1-2 mm from the front or rear ligaments. Partial extending ligaments typically run for about 15 mm from the front or rear of the element.

FIG. 3 provides a view of the planar monolith 10 shown in FIG. 1 after coating. The present coating pattern is described with respect to one pair of opposing dielectric barriers 18, with the pair being referred to as first barrier 24 and second barrier 26. Conductive material 30 is disposed on the passage interior surface of the first barrier 24 to provide a first polarity conductor on the passage interior surface of the first barrier 24. Conductive material 30 is disposed on the passage exterior surface of the second barrier 26 to provide a second polarity conductor 30, whereby the second barrier 26 provides the single dielectric barrier layer 18. The second polarity conductor serves as a conductor 30 on the passage interior surface of the adjacent exhaust channel in repetitive fashion until a reactor element of the desired size is achieved. In this way, the reactor provides a configuration that is free of dedicated conductive passages, providing improved volumetric efficiency.

In a preferred embodiment, an electrode coating pattern disposes conductive material 30 along each dielectric barrier 18 extending fully to outer walls 20 forming side bus paths thus eliminating the need for internal bus paths thereby improving volumetric efficiency. Bus connections are provided on opposite sides of the reactor with only the power side bus connection 32 shown in FIG. 3.

Preferably, the upper exhaust channels (upper row 34) are eliminated and an insulated coating (not shown) applied to the outside of the reactor. Alternately, the upper row 34 is plugged to prevent exhaust flow during operation. Preferably, when plugging is employed, the upper row 34 is prepared having a smaller gap size than the remainder of the extruded monolith.

Figure 4:
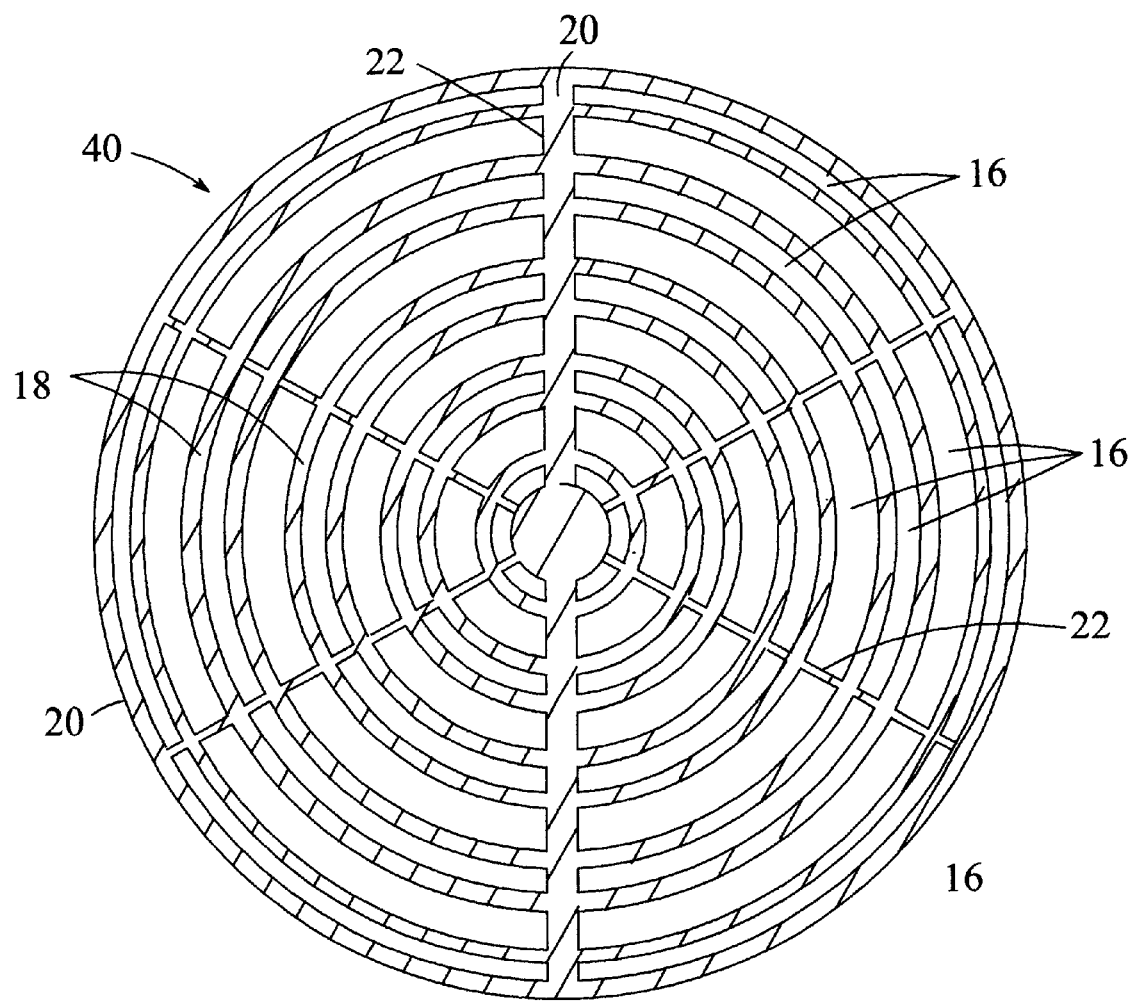
FIG. 4 provides a view of an as-extruded swept-shaped monolith in accordance with an alternate embodiment of the present invention.

FIG. 4 provides a curved, swept-shaped as-extruded substrate 40 having a thick outer wall 20 surrounding a plurality of concentric exhaust channels 16 defined by dielectric barriers 18. The curved, swept shape provides considerable flexibility to accommodate various vehicle packaging requirements, and may comprise any suitable curved shape, such as round, oval, etc.

Figure 5:
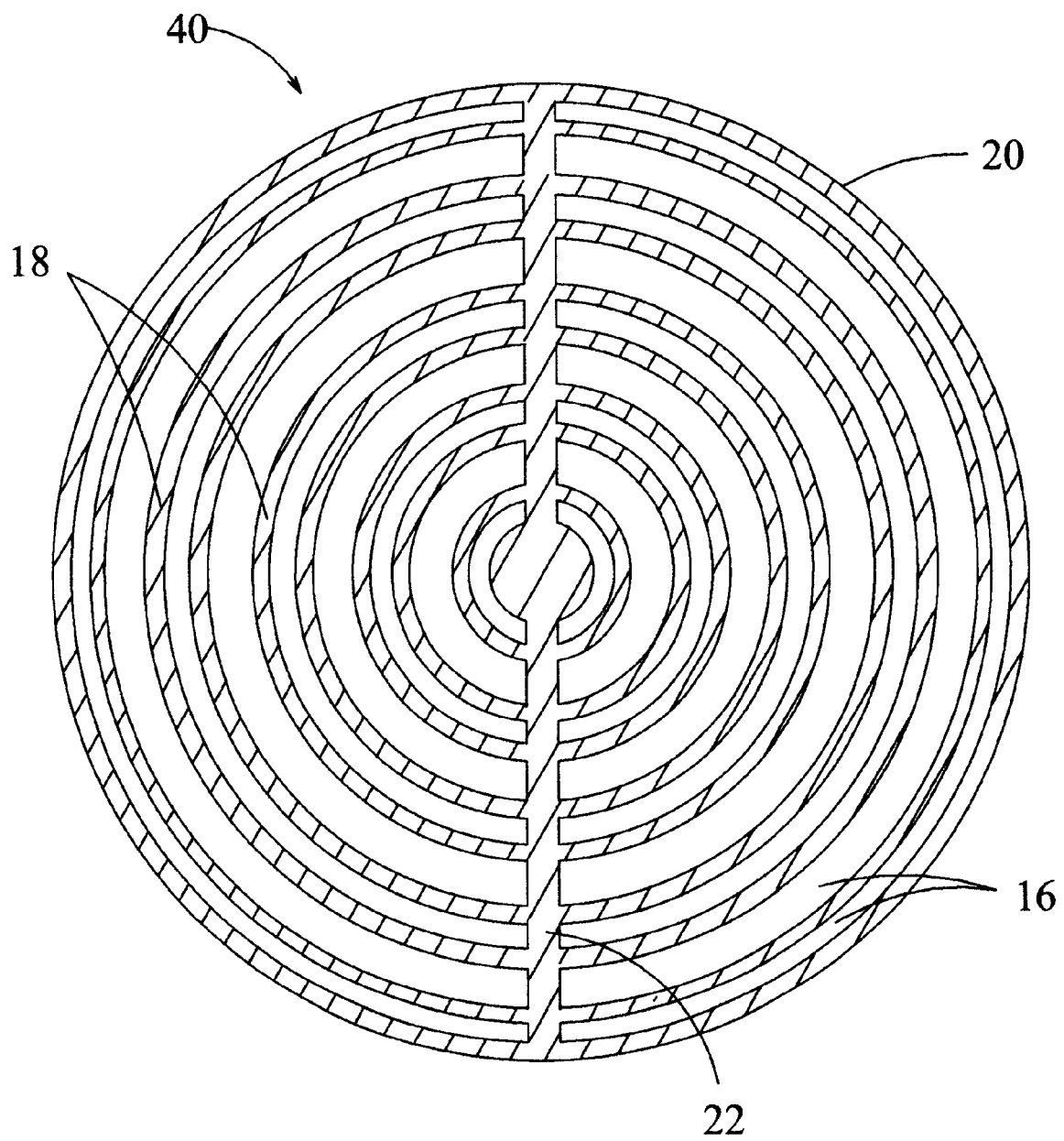
FIG. 5 provides a view of an as-extruded swept-shaped monolith having few structural support ligaments.

If provided, structural support ligaments 22 are integrally formed as part of the extruded substrate. One or more structural support ligaments 22 may further serve as a substrate for conductive bus paths. In a preferred embodiment, minimal structural support ligaments 22 are provided. FIG. 5 provides a swept-shape monolith 40 having few internal ligaments 22. This embodiment provides maximum conversion efficiency for swept-shaped monoliths by reducing the deleterious effect of ligaments on constituent conversion efficiency while providing two ligaments for structural and bus path support.

Figure 6:
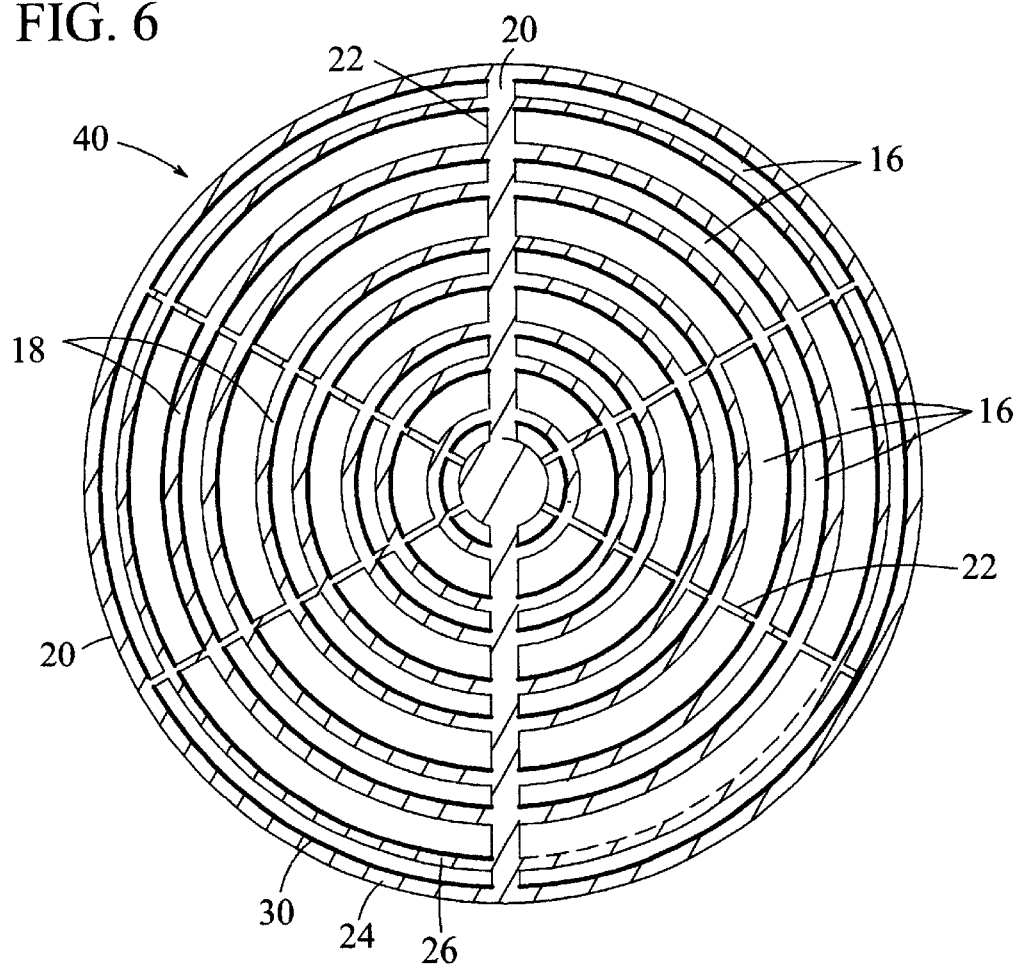
FIG. 6 provides a view of the swept-shaped monolith of FIG. 4 after coating.

A coated swept-shaped monolith 40 is shown in FIG. 6. Opposing pairs 24, 26 of dielectric barriers 18 are coated with a conductive material 30 in the manner described with respect to the planar monolith 10 of FIG. 3 to provide opposite polarity conductors to adjacent exhaust channels in repetitive fashion until a reactor element of the desired size is achieved. As with the planar embodiments, this embodiment provides a configuration that is free of dedicated conductive passages, providing improved volumetric efficiency.

The conductive material 30 may comprise any conductive material providing the desired durability, temperature capability, and desired cost parameters. Typically, the conductive material will perform at temperatures up to about 600° C. Suitable conductive materials include, but are not limited to, silver inks, aluminum inks, and copper inks. The conductive material 30 used herein may comprise conductive in having about 0.1% to about 5% finely dispersed small-sized dielectric particles, typically with silver or platinum power metal. Providing the finely dispersed dielectric particles to the conductive ink provides improved bonding strength between the ink and the dielectric barriers 18, thus increasing durability.

Disposing the conductive material 30 may be accomplished using known methods to effect the present coating pattern. In one embodiment, disposing comprises tilting the monolith 10 or 40 and applying low viscosity conductive ink to exhaust channel entryways, allowing the ink to flow through the exhaust channels coating the desired interior surface and discharge at the exhaust channel exits. A temporary mask is provided on the opposing interior exhaust channel surface. The temporary mask may comprise a wax or similar material that will dissolve or vaporize when the conductive coating is fired.

The conductive ink may further comprise a binder, such as, for example, ethyl cellulose, or other thixotropic agent, to effect a reduced viscosity ink during application of high shear forces and an increased viscosity ink when shear forces are removed.

Alternately, disposing may comprise plugging one end of the exhaust channels 16, tilting the monolith 10, 40, and adding a measured amount of conductive ink while the monolith 10, 40 remains tilted. While tilted, vibrating may be used to increase ink flow through the exhaust channels 16. Any excess ink is drained out of the exhaust channels 16.

In another embodiment, the conductive material 30 is applied using a nib. The nib is employed to inject a precise measured amount of ink into the exhaust channels 16. Air is blown out of the nib, forcing the ink 30 through the channels 16. Excess ink 30, if any, is drained out of the channels 16.

Figure 7:
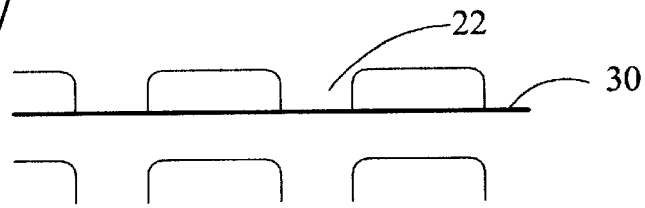
FIG. 7 provides an end view of a robust electrical connection using cut back ligaments in accordance with another embodiment of the present invention.
Figure 8:
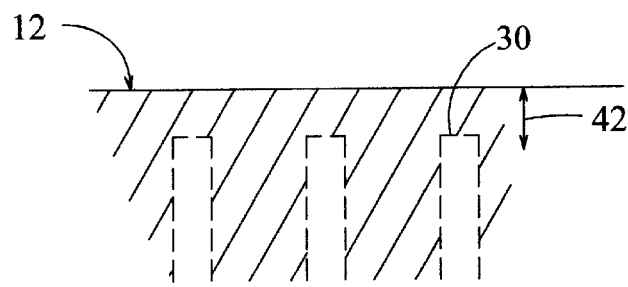
FIG. 8 provides a side view of the embodiment of FIG. 7.

While providing electrical connections across ligaments 22, if any, along exhaust channels 16, or conductive bus paths, a robust electrical connection is desired. In one embodiment, a robust electrical connection is achieved by removing a portion of the ligaments 22 along exhaust channels 16 or conductive bus paths. FIG. 7 shows a substrate end view and FIG. 8 shows a side view of a robust electrical connection between adjacent exhaust channels 16 or conductive bus path using ligament relief (i.e., ligaments are set back or cut back a distance from ends of the substrate). The relief distance 42 for ligaments 22 is typically about 5 to about 15 millimeters from the substrate face 12. The conductive material 30 extends around the cut back ligament 22.

Alternately, a stencil mask is used to dispose the conductive material 30 in the desired pattern. A low Viscosity conductive ink spray is applied to create a conductive line from one side of a ligament 22 to the other.

Figure 9:
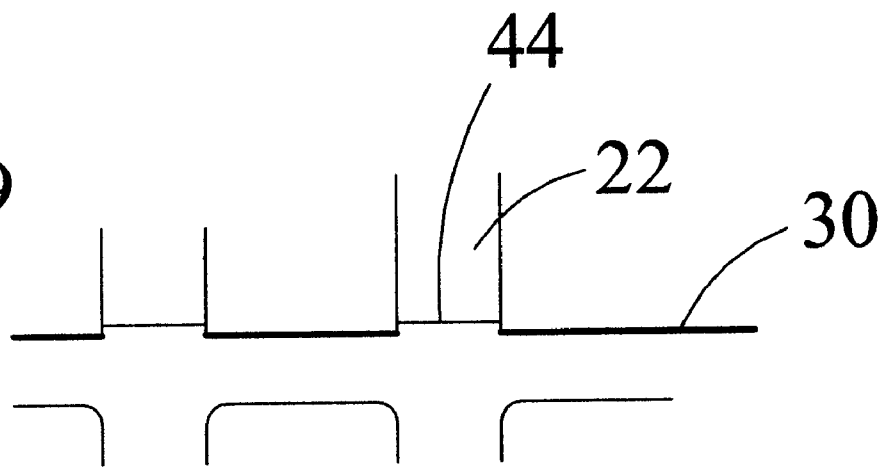
FIG. 9 provides an end view of an alternate embodiment for robust electrical connection using U-clips.
Figure 10:
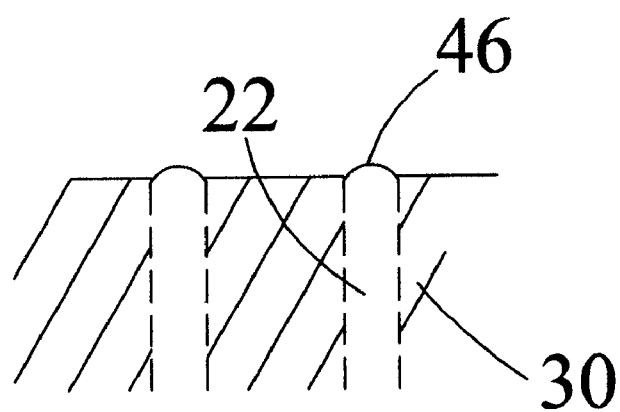
FIG. 10 provides a side view of an embodiment for robust electrical connection using C-clips.
Figure 11:
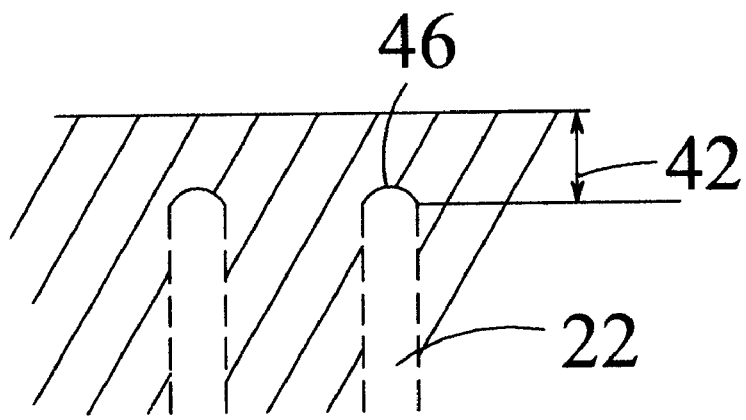
FIG. 11 provides a side view of an alternate embodiment providing robust electrical connection using C-clips in combination with cut back ligaments.

In yet another embodiment, particularly advantageous for repairing a poor connection across a ligament 22, comprises applying a wire U-clip to the ligaments 22 that separate adjacent exhaust channels 16 that should be connected. FIGS. 9, 10, and 11 show embodiments providing a robust electrical connection using a U-clip or C-clip. In FIG. 9, a U-clip 44 connects conductive material 30 across ligament 22 (end view). in FIG. 10, a C-clip 46 is used to connect conductive material 30 across ligament 22 (side view). FIG. 11 shows a side view of a robust electrical connection using a C-clip 46 connecting conductive material 30 across ligament 22 in combination with ligament 22 relief 42.

To prevent electrical leakage between cells at the front and rear of the coated monolith 10, 40, it is preferable to dispose the conductive material 30 to within about 5 to about 15 millimeters short of the end of the exhaust channels 16. Preferably, masking is employed to prevent coating at end portions of the exhaust channels 16. More preferably, the conductive material 30 is disposed inward of the mask to minimize overcoating. Leakage may be prevented by providing a dielectric barrier layer at the ends of the monolith 10, 40 between cells. An encapsulent dielectric or bonded dielectric shape may be secured to the ends of the monolith 10, 40 for increased protection.

Figure 12:
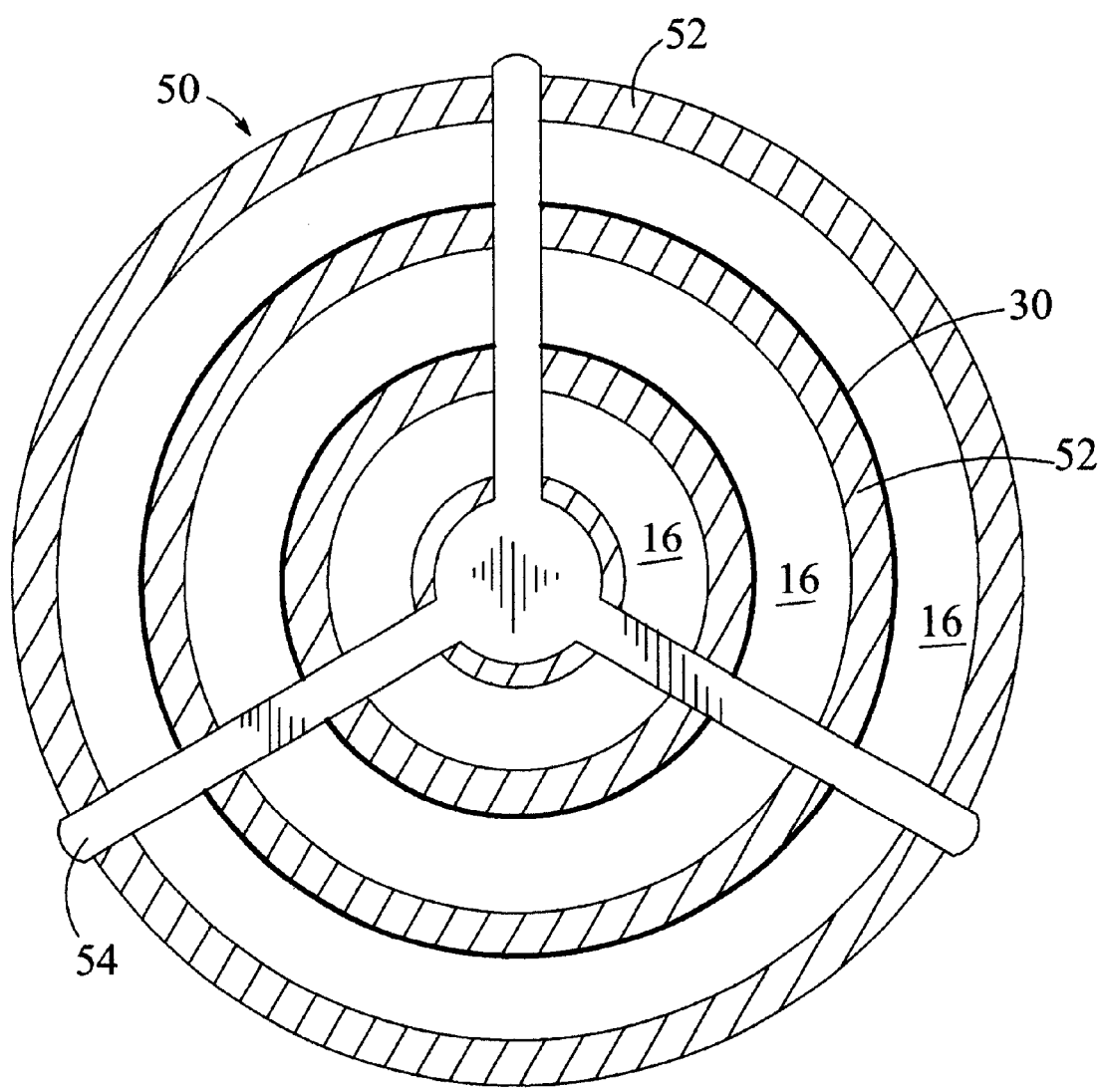
FIG. 12 provides a view of an alternate embodiment comprising nested concentric tubes.

FIG. 12 shows another embodiment of the present invention comprising a concentric reactor element 50 having a plurality of nested concentric dielectric tubes 52 forming exhaust channels 16 between adjacent tubes 52. Outer surfaces of tubes 52 are coated to within about 5 to about 15 millimeters of each end, for example, with conductive ink 30. Drying and firing fuses the ink 30 to the dielectric tubes 52. The coated tubes 52 are inserted into each other and secured, such as with spider ligament 54, at each end of the tubes 52. Electrical connections are provided over the ligaments and connected to each tube conductive region 30. The spider ligament 54 serves as a bus path to provide the electrical connections. Coating is preferably by spray application or pad transfer methods. In yet another embodiment, the conductive material 30 is disposed on inner surfaces of the concentric dielectric tubes 52.

The present reactors are prepared by extruding a dielectric material to provide a planar or swept-shape monolith having a plurality of dielectric barriers defining exhaust channels therebetween and selectively coating the dielectric barriers to provide a "conductor-single structural dielectric barrier-exhaust channel-conductor" arrangement. Individual cells of the reactor element are thereby defined by a single structural dielectric barrier rather than a double dielectric barrier. Coating preferably comprises supplying a mask to the extruded monolith, coating the masked monolith with conductive material, drying, and firing, as needed. Electrical connections are made, typically by attaching terminations to the bus paths with insulating connects, wrapping an insulator, such as an intumescent matt, around the monolith, inserting shielded wire through the reactor housing, and installing the monolith into a housing.

In one embodiment, reduced ligament 22 spacing is achieved using a binder, such as ethyl cellulose, in the dielectric extrusion formulation. During the extrusion process, shear forces are very high as the substrate material is forced through the die and the material flows readily. Shear forces can be increased and controlled using tape calendering type equipment. As the substrate material exits the die, shear forces are reduced or eliminated causing the green extrudate to hold shape. The monolith is then dried and fired according to known methods.

In addition, a reactive gas, such as oxygen, can be flushed over the extrudate as it exits the dye, thereby initiating chemical reactions that impart mechanical strength to the monolith.

Further, a highly active (small particle size) dielectric material formulation may be employed to increase green strength and reduce sintering temperatures. A high vapor pressure solvent, such as ethanol or methyl ethyl ketone, may be employed. The high vapor pressure solvent evaporates quickly, enhancing green strength. Plasticizers, such as benzyl butyl phthalate, may be added to the dielectric formulation to provide a green extrusion having increased durability.

Heating may be employed in combination with other methods to fast dry or bisque fire the extrusion material as it exits the die. Heating may be with heat lamps, forced air, induction coils, microwaves, or other suitable methods.

In addition, ligament spacing is achieved by extruding the monolith material into a liquid, such as a glycol mixture, that serves to support the extrudate while reactions occur to provide sufficient strength to the extruded monolith for drying and firing. The liquid has near neutral buoyancy compared to the extrudate so that the part is nearly weightless in the bath. This provides the support for the green extrudate. This method is particularly advantageous for preparing the embodiments shorten in FIGS. 2 and 5.

Ligament-free embodiments may be prepared using the liquid method. Preferably, concentric tubes are extruded, preferably at the same time, into the near neutral buoyancy liquid. Take up shapes may be used in the bath to prevent the concentric tubes from hitting one another. After allowing time for reactions to occur imparting sufficient strength, the concentric tubes are removed from the bath, dried and fired.

Vertical extrusion assists in reducing the force on the dielectric barriers due to gravity, which can result in sagging. Vertical extrusion may be combined with extruding the monolith into a liquid to further lower effective forces on the extrudate, further preventing deformation.

In addition, preferably in combination with vertical extrusion, relatively long die features may be constructed to support the extrudate while initial reactions occur. The long die features may be heated to increase the reaction rate. The features are disposed adjacent the die exit and do not have to form an integral part of the die.

Post drying and firing processing of the extruded substrate is also employed to remove ligaments. A 3-axis milling machine or machining system with diamond or carbide cutters, for example, may be used, typically in combination with a vision system, to cut through selected ligaments and finish grind to completely remove the ligaments. Laser or water-jet cutting machines having at least 3 degrees of freedom may be used to cut through ligaments. In this method, the depth of extrudate that can be treated is less than that using diamond or carbide cutters with a 2-axis machining system. Electrical discharge machining may also be used to remove ligaments.

A preferred method to remove ligaments comprises using ultrasonic vibrating. The high frequency vibration moves a hardened cutting tool across the ligaments causing ligament degradation. Constant force follow-up progressively moves the vibrating hardened cutting tool through the length of the monolith.

Another embodiment of the present method comprises co-extruding ligaments using a degradable material. For example, a thermally compatible ligament material is co-extruded to support the monolith structure during firing until sufficient strength is achieved. The fired co-extruded monolith is dipped into an acid solution that preferentially attacks the degradable ligaments, leaving the remaining monolith, including dielectric barriers and outer walls, unaffected.

Another embodiment of the present method comprises removing the ligaments after drying, when an intermediate strength has been achieved, before the ligaments and monolith are hardened. A 3-axis machining method is particularly suitable for this method.

While the invention has been described by reference to certain preferred embodiments, it should be understood that numerous changes could be made within the spirit and scope of the inventive concepts described. Accordingly, it is intended that the invention not be limited to the disclosed embodiments, but that it have the full scope permitted by the language of the following claims.

What is claimed is:

1. A single dielectric barrier non-thermal plasma reactor comprising:
   an extruded non-thermal plasma reactor substrate having a plurality of dielectric barriers defining exhaust channels between pairs of said dielectric barriers; and
   a conductor selectively disposed on one interior surface of each exhaust channel to provide a reactor having a conductor-single structural dielectric barrier-exhaust channel-conductor repeating arrangement.

2. The reactor of claim 1, wherein bus paths are disposed on sides of said reactor.

3. The reactor of claim 1, wherein an electrode coating pattern for said conductor comprises conductive material disposed along each dielectric, barrier and extending to outer walls for inside bus path, thereby providing a reactor that is free of internal bus paths.

4. The reactor of claim 1, wherein said extruded substrate comprises parallel plates, parallel plates having discrete spacers, C-shaped plates, I-shaped plates, swept-shaped substrates, round shapes, or oval shapes.

5. The reactor of claim 1, wherein said reactor comprises minimal internal support ligaments.

6. The reactor of claim 1, wherein said reactor is internal support ligament-free.

7. The reactor of claim 1, wherein exhaust channels and conductive bus paths are structural support ligament-free, enhancing robust electrical connection for said reactor.

8. The reactor of claim 1, wherein structural support ligaments are set back a distance from each end of said substrate.

9. The reactor of claim 1, further comprising:
partial extending structural support ligaments disposed from front or rear of said reactor, said partial ligaments provided at a length sufficient to keep plasma fields free of said partial extending ligaments.

10. The reactor of claim 9, wherein said partial extending structural support ligaments are provided for about 15 mm from front or rear ends of said reactor element.

11. The reactor of claim 1, further comprising connections disposed across structural support ligaments for connecting conductive material on either side of said structural support ligaments.

12. The reactor of claim 1, wherein said reactor element comprises a plurality of nested concentric dielectric tubes forming exhaust channels between adjacent tubes;
a device for securing said concentric tubes; and
conductors comprising conductive material disposed on outer tube surfaces or inner tube surfaces.

13. The reactor of claim 12, wherein said securing device is a spider ligament.

* * * * *